United States Patent
Chebi et al.

(10) Patent No.: US 6,759,336 B1
(45) Date of Patent: Jul. 6, 2004

(54) METHODS FOR REDUCING CONTAMINATION OF SEMICONDUCTOR SUBSTRATES

(75) Inventors: Robert Chebi, Fremont, CA (US); David Hemker, San Jose, CA (US)

(73) Assignee: Lam Research Corporation, Fremont, CA (US)

(*) Notice: Subject to any disclaimer, the term of this patent is extended or adjusted under 35 U.S.C. 154(b) by 0 days.

(21) Appl. No.: 10/295,912

(22) Filed: Nov. 18, 2002

Related U.S. Application Data

(62) Division of application No. 09/820,690, filed on Mar. 30, 2001, now Pat. No. 6,528,427.

(51) Int. Cl.$^7$ ............................................. H01L 21/311
(52) U.S. Cl. .................... 438/694; 438/743; 438/703; 438/904; 438/710; 438/913; 414/935; 414/936; 414/937; 414/938; 414/939; 414/940
(58) Field of Search ................................ 438/694, 743, 438/703, 904, 710, 913; 414/935, 936, 937, 938, 939, 940

(56) References Cited

U.S. PATENT DOCUMENTS

| | | | |
|---|---|---|---|
| 4,431,473 A | 2/1984 | Okano et al. | |
| 4,790,258 A | 12/1988 | Drage et al. | |
| 4,842,683 A | 6/1989 | Cheng et al. | |
| 4,863,561 A | 9/1989 | Freeman et al. | |
| 4,870,030 A | 9/1989 | Markunas et al. | |
| 4,906,328 A | 3/1990 | Freeman et al. | |
| 4,940,505 A | 7/1990 | Schachameyer et al. | |
| 5,018,479 A | 5/1991 | Markunas et al. | |
| 5,106,764 A | 4/1992 | Harriott et al. | |
| 5,180,435 A | 1/1993 | Markunas et al. | |
| 5,215,619 A | 6/1993 | Cheng et al. | |
| 5,300,187 A | 4/1994 | Lesk et al. | |
| 5,314,538 A | 5/1994 | Maeda et al. | |
| 5,328,555 A | 7/1994 | Gupta | |
| 5,332,444 A | 7/1994 | George et al. | |
| 5,350,480 A | 9/1994 | Gray | |
| 5,403,434 A | 4/1995 | Moslehi | |
| 5,622,400 A | 4/1997 | George | |

(List continued on next page.)

Primary Examiner—Matthew Smith
Assistant Examiner—Victor Yevsikov
(74) Attorney, Agent, or Firm—Burns, Doane, Swecker & Mathis, LLP

(57) ABSTRACT

Methods for reducing contamination of semiconductor substrates after processing are provided. The methods include heating the processed substrate to remove absorbed chemical species from the substrate surface by thermal desorption. Thermal desorption can be performed either in-situ or ex-situ. The substrate can be heated by convection, conduction, and/or radiant heating. The substrate can also be heated by treating the surface of the processed substrate with an inert plasma during which treatment ions in the plasma bombard the substrate surface raising the temperature thereof. Thermal desorption can also be performed ex-situ by applying thermal energy to the substrate during transport of the substrate from the processing chamber and/or by transporting the substrate to a transport module (e.g., a load lock) or to a second processing chamber for heating. Thermal desorption during transport can be enhanced by purging an inert gas over the substrate surface.

19 Claims, 3 Drawing Sheets

U.S. PATENT DOCUMENTS

| | | |
|---|---|---|
| 5,716,495 A | 2/1998 | Butterbaugh et al. |
| 5,821,175 A | 10/1998 | Engelsberg |
| 5,950,071 A | 9/1999 | Hammond et al. |
| 5,963,833 A | 10/1999 | Thakur |
| 5,966,586 A | 10/1999 | Hao |
| 5,994,240 A | 11/1999 | Thakur |
| 6,124,211 A | 9/2000 | Butterbaugh et al. |
| 6,140,247 A | 10/2000 | Maraoka et al. |
| 6,187,682 B1 | 2/2001 | Denning et al. |
| 6,189,483 B1 * | 2/2001 | Ishikawa et al. ......... 118/723 E |
| 6,273,104 B1 * | 8/2001 | Shinbara et al. ........... 134/25.4 |
| 6,368,776 B1 * | 4/2002 | Harada et al. .............. 430/327 |
| 2002/0063119 A1 * | 5/2002 | Tanaka et al. .............. 219/390 |
| 2002/0134512 A1 * | 9/2002 | Adachi et al. ......... 156/345.51 |

* cited by examiner

METHODS FOR REDUCING CONTAMINATION OF SEMICONDUCTOR SUBSTRATES

This application is a divisional of 09/820,690 filed on Mar. 30, 2001 now U.S. Pat. No. 6,528,427.

FIELD OF THE INVENTION

The present invention relates generally to methods of reducing contamination of semiconductor substrates and, in particular, to in-situ and ex-situ methods of thermally desorbing adsorbed chemical species from the surfaces of semiconductor substrates after processing.

BACKGROUND OF THE INVENTION

Semiconductor substrates are typically subjected to various types of plasma processing such as etching and deposition during the manufacture of semiconductor devices. During plasma processing of semiconductor substrates, however, chemical species present in the reactor can become adsorbed onto the surface of the substrate. Upon removal of the substrate from the plasma chamber, these adsorbed chemical species can react with moisture in the air to form particles. These particles can lead to lower device yields or can reduce the long term reliability of semiconductor devices.

Various methods of removing contaminants from semiconductor substrates have been employed. For example, wet cleaning processes have been used in semiconductor device manufacture to remove contaminants from the substrate surface. However, as device dimensions shrink, it has become increasingly difficult to effectively clean submicron structures using liquid processes. Also, it is often difficult to remove residual moisture from the cleaning process. This moisture can be a potential source of post-manufacture corrosion. Further, wet cleaning involves an additional process step which can add to the cost of the process.

Surface contamination of the substrate surface can also be reduced by dry cleaning methods. Dry cleaning methods do not expose the surface of the substrate to moisture. Additionally, dry cleaning has the added advantage of allowing fewer transfers of the substrate between processes during manufacture and, consequently, fewer exposures of the substrate to air. Methods of dry cleaning semiconductor substrates are disclosed in U.S. Pat. Nos. 4,863,561; 4,906,328; 5,300,187; 5,332,444; 5,350,480; 5,403,434; 5,716,495; 5,821,175; 5,950,071; 5,963,833; 5,994,240; and 6,124,211.

Plasma processes are typically used to remove native oxides before deposition processes and to remove photoresists (e.g., photoresist stripping) after etching. Removal of contaminants by plasma processing, however, is also known. Gupta (U.S. Pat. No. 5,328,555), for example, discloses a process of removing particles from the surface of a substrate by forming a plasma from an inert plasma precursor gas. According to Gupta, the inert plasma lifts loosely adhered particles from the surface of the substrate. Gupta further discloses increasing the flow of the inert gas without increasing the pressure in the vacuum chamber, to "sweep" the particles beyond the surface of the substrate, where they can be removed by the vacuum chamber exhaust system. According to Gupta, particles having a size of about 0.1 micron or larger can be removed in this manner. Denning et al. (U.S. Pat. No. 6,187,682 B1) disclose a method for performing a cleaning operation in-situ along with a physical sputtering operation. The method of Denning et al. involves placing a substrate into a chamber and generating a plasma within the chamber using an inert, noble, or reducing gas. The gas is ionized to form ions which are accelerated towards the substrate to result in physical sputtering of contaminants and oxides from the substrate surface. Following this cleaning operation, power supplied within the chamber is altered so that the ions impact a sputter target to sputter material onto a clean surface of the substrate in an in-situ manner.

There still exists a need for a method of rapidly removing adsorbed chemical species from the surfaces of processed semiconductor substrates in situ before these chemical species can react with moisture to form particles.

In order to transfer a semiconductor substrate into and out of a processing chamber, it is conventional to utilize various robot arm and lift pin arrangements. See, for example, U.S. Pat. Nos. 4,431,473; 4,790,258; 4,842,683; 5,215,619; 5,314,538; and 5,622,400. The transfer of substrates into and out of a processing chamber can itself be a source of particle contamination. Further, as set forth above, any adsorbed chemical species remaining on the substrate surface after processing can react with moisture to form particles. It would therefore be desirable to remove adsorbed chemical species from a substrate surface during transfer of the substrate from a processing chamber. Such an ex-situ technique would allow for increased process efficiencies by utilizing the time in which the substrate is being transferred.

SUMMARY OF THE INVENTION

According to a first embodiment of the invention, a method of reducing surface contamination of a semiconductor substrate is provided. The method includes mounting the substrate on a substrate support in a first processing chamber, processing the substrate, and heating the substrate. As a result of processing, chemical species in the reactor are adsorbed onto the substrate surface. During the heating step, the temperature of the substrate is increased such that adsorbed chemical species are removed from the substrate surface by thermal desorption. Heating can be performed in-situ or ex-situ. The substrate can be heated by conduction, convection, radiant heating and/or, in a preferred embodiment, by treating the substrate with an inert plasma. The method can also include a step of transporting the substrate out of the plasma reactor using a substrate transport mechanism wherein, during the transport step, thermal energy is applied to the substrate and an inert gas is purged over the surface of the substrate. Thermal energy can be applied to the substrate via conduction from a heated transport mechanism, via convection from a radiant heater mounted on the substrate transport mechanism or via forced convection by heating the inert gas and purging the heated inert gas over the substrate surface to heat the substrate.

According to another embodiment of the invention, the method further comprises steps of supplying a heat transfer gas between the substrate and substrate support during the processing step and shutting off the supply of heat transfer gas prior to the heating step. In a further preferred embodiment, a lifter mechanism lifts the substrate off of the substrate support prior to or during the heating step and heating is performed by radiant heating, convection heating, treating the substrate with an inert plasma or combinations thereof.

According to a further embodiment of the invention, a substrate transport mechanism is provided. The substrate transport mechanism includes an arm, a substrate support surface adapted to support a semiconductor substrate during transport, one or more heaters adapted to heat a semiconductor substrate supported on the support surface, and a gas supply adapted to purge an inert gas over the surface of a semiconductor substrate supported on the support surface. The heaters may be resistance heaters or radiant heaters. Alternatively, the inert gas supply can be adapted to purge a heated inert gas over the substrate to heat the substrate by forced convection.

DETAILED DESCRIPTION OF THE PREFERRED EMBODIMENTS

Figure 1:
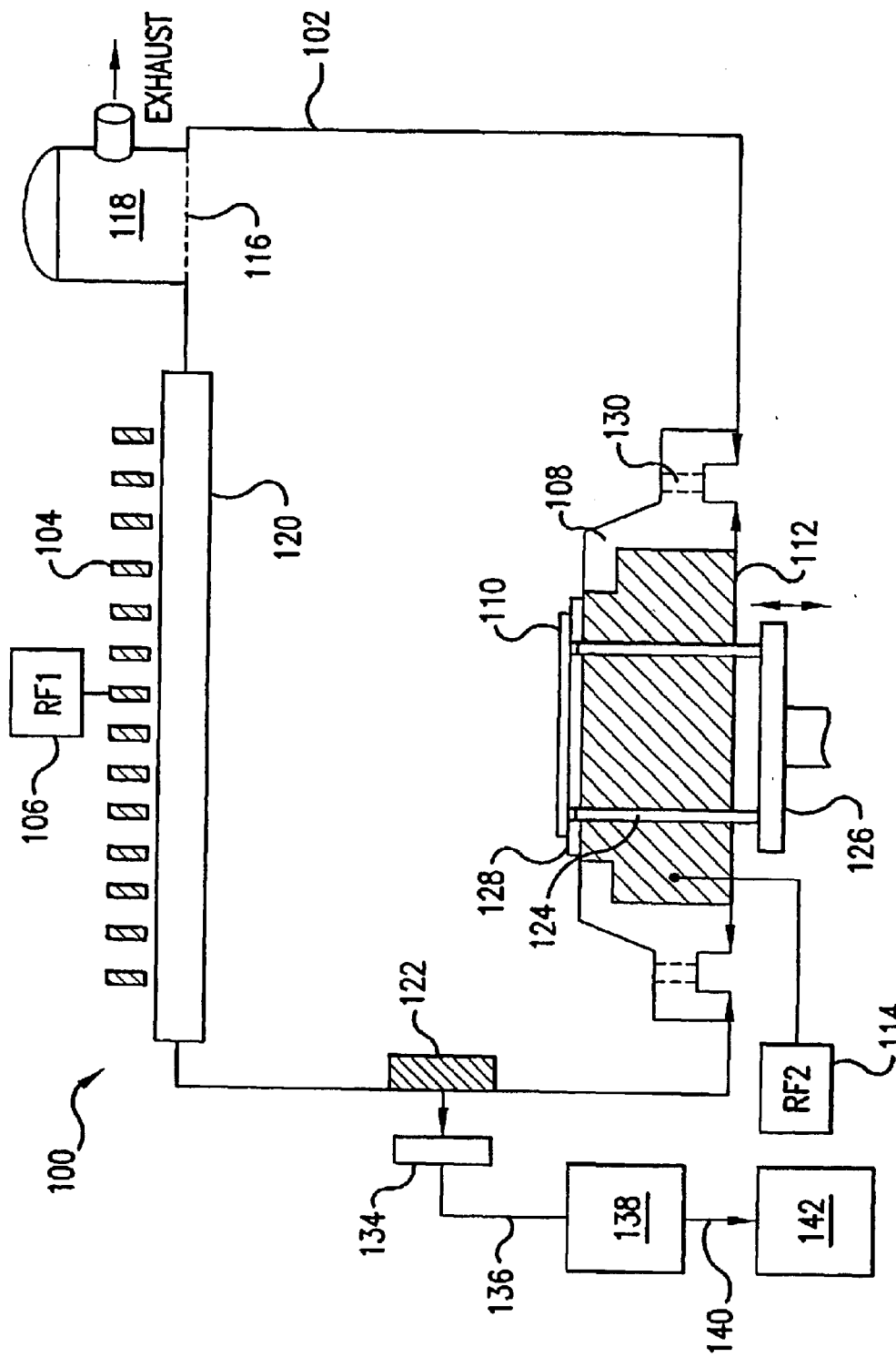
FIG. 1 is a schematic of a prior art plasma reactor suitable for use with the present invention.

As set forth above, chemical species adsorbed onto semiconductor substrate surfaces as a result of etching or other processing can react with moisture to form particle contaminants. These contaminants, if they remain on the surface of the substrate, can cause defects in a semiconductor device manufactured from the substrate thus resulting in decreased yields and/or reduced device life. Alternatively, these contaminants can be transferred from the processed substrate to other substrates causing defects in the subsequent processing of those other substrates. For example, if a freshly etched substrate containing surface contaminants comes into contact with unetched substrates in a closed environment such as a load lock, FOUP or cassette, the adsorbed contaminants can be transferred to the surfaces of the other substrates. This cross-contamination can occur through a time-dependent surface adsorption/desorption mechanism. Contaminants adsorbed on an unetched substrate surface can have a detrimental effect on substrate integrity if not removed prior to further processing. If the substrates are being etched, for example, the transferred contaminants can lead to micromasking defects during subsequent etching processes.

Adsorbed chemical species are typically bonded to the substrate surface by very weak chemical forces (e.g., Van Der Waals forces). In the present invention, these adsorbed chemical species can be reduces or eliminated from the substrate surface by thermal desorption of the chemical species either in-situ, ex-situ or by using a combination of in-situ and ex-situ thermal desorption.

In a first embodiment of the invention, thermal desorption can be done in-situ by heating the substrate. In this manner, the temperature of the substrate and, consequently, the surface mobility of the adsorbed chemical species can be increased. As the substrate temperature increases, thermal agitation of the adsorbed species will also increase, eventually overcoming the relatively weak forces bonding the adsorbed species to the substrate. In the present invention, the substrate can be heated by any method or combination of methods including, but not limited to, conduction, convention and radiant heating. In a preferred embodiment of the invention, however, the substrate is heated by treatment with an inert plasma.

Since adsorbed chemical species present on the substrate surface are removed by thermal desorption, chemical reactions of the adsorbed material with species in the plasma are not necessary or even desirable. It is further preferred that ions in the inert plasma bombard the substrate surface during treatment with insufficient energy to achieve sputtering of the surface. In this manner, damage to the substrate can be minimized. Thus, in the present invention, ion bombardment will preferably only cause the temperature of the substrate to increase without resulting in physical sputtering of the surface, If thermal desorption occurs in the gas phase, the desorbed chemical species can be pumped away from the substrate. By applying this process after plasma processing but before the substrate is transported from the processing chamber, the concentration of adsorbed chemical species on the substrate surface can be reduced or eliminated.

In the present invention, the characteristics of the inert plasma (e.g., ion energy) and the exposure time can be adjusted depending upon the adsorbents present on the substrate surface. Generally, at higher temperatures desorption will occur more rapidly. However, higher temperatures may result in damage to the substrate. This is particularly true if an organic material such as a photoresist is present.

In a second embodiment of the invention, thermal desorption can be performed ex-situ. Ex-situ thermal desorption can, for example, be accomplished by applying thermal energy to the substrate during transport or removal of the substrate from the reaction chamber. Thermal desorption can also be performed ex-situ in a transport module (e.g., a load lock) or in a separate processing chamber using any of the aforementioned methods of heating the substrate (e.g., conduction, convection, radiant heating and/or treating with an inert plasma). In a preferred embodiment, thermal desorption is performed prior to the substrate being placed in close proximity to other substrates. In this manner, cross-contamination can be minimized.

In a preferred embodiment of the present invention, thermal energy can be applied to the substrate ex-situ by using a heated substrate transport mechanism such as a robotic arm to remove the substrate from the process chamber. In a further preferred embodiment, an inert gas is purged over the surface of the substrate during transport and while the substrate is being heated. In this manner, thermal desorption of chemical species present on the substrate surface can be further enhanced.

If the substrate has a photoresist layer, any of the aforementioned thermal desorption methods, alone or in combination, can be employed prior to a photoresist stripping process. Although the stripping process will generally remove the adsorbed materials from the substrate surface, it may still be desirable to thermally desorb adsorbed materials from the substrate surface prior to the photoresist stripping process. In this manner, cross-contamination of other substrates can be minimized. When treating a semiconductor substrate having a photoresist layer with an inert plasma, the temperature of the photoresist will preferably be maintained below temperatures at which the photoresist can reticulate or burn. This temperature will vary depending upon the material from which the photoresist is made.

In order to illustrate the invention, a polysilicon etch will be used as an example. The present invention, however, can be employed with any process (e.g., plasma etching, CVD, PECVD, etc.) wherein undesirable chemical species are adsorbed onto the surfaces of the substrate during processing.

FIG. 1 illustrates a schematic diagram of a low pressure, high conductance plasma etch system known as the TCPI™ 9400, which is available from Lam Research Corporation of Fremont, Calif. Although the TCP™ 9400 is chosen to simplify the discussion herein, it should be borne in mind that the invention is not limited to low pressure, high conductance systems, and may in fact apply to any plasma processing system, including those designed for etching, deposition, etc.

Referring to FIG. 1, a plasma processing system 100 is shown. The plasma processing system includes a plasma processing chamber 102. Plasma processing chamber 102 may have its interior walls formed of any suitable material, e.g., anodized aluminum. Above chamber 102, there is disposed an RF antenna which, in FIG. 1, is shown implemented by a transformer coupled plasma (TCP™) coil. Other RF energy sources may also be used, however, such as magnetron, helicon, capacitively coupled, inductively coupled, ECR, etc. Coil 104 is energized by a radio frequency (RF) system 106 via an appropriately designed matching network (not shown). To provide an electrical path to ground, the walls of processing chamber 102 are typically grounded.

Within processing chamber 102, there is provided a gas injection ring 108, which, in the present example, represents a ring-shaped manifold having thereon a plurality of gas outlets 130 for releasing gaseous source materials, e.g., the etchant source gases, into the interior of chamber 102. The gaseous source materials may also be released from ports built into the walls of the chamber itself or from an appropriately designed shower head apparatus, if desired.

Substrate 110 is introduced into processing chamber 102 and disposed on a substrate support 112, which acts as a second electrode and is preferably biased by an RF system 114 (also typically via a matching network). The substrate support 112 will typically include a chuck 128, usually an electrostatic (ESC) chuck, which may be of a monopolar or a bipolar design. The substrate support may, however, include a mechanical chuck or any other suitable support structure for substrate 110. A heat transfer gas such as helium may be introduced under pressure (e.g., about 5–10 Torr in one embodiment) between substrate support 112 and substrate 110 to act as a heat transfer medium for accurately controlling the substrate's temperature during processing, e.g., to ensure uniform and repeatable etching results. The substrate temperature is typically maintained at a level below about 60° C., usually from 50 to 60° C., during etching. Chuck 128 may also be provided with openings for lift pins 124. Lift pins 124 are shown as part of lift pin assembly 126. By raising or lowering lift pin assembly 126, substrate 110 can be raised or lowered from the surface chuck 128. Lift pin assembly 126 can be used to elevate the substrate off of chuck 128 to facilitate removal of substrate 110 from processing chamber 102 by a substrate transport mechanism (not shown). As shown in FIG. 1, the pressure within processing chamber 102 can be controlled by exhausting gas through exhaust port 116, which is coupled to vacuum pump 118.

In order to monitor the substrate during processing and/or thermal desorption, chamber 102 can include window 122. Window 122 allows light, indicated by arrow 132, that is produced by the reactions within chamber 102 to be detected by an optical sensor 134 outside of the chamber. Optical sensor 134 measures the intensity of light 132 emitted through window 122 during the etching process. Optical sensor 134 can produce an electrical signal indicated by arrow 136 which represents the intensity of light 132. A computer 138 can then use a detection algorithm and electrical signal 136 to determine the endpoint for the processing and/or thermal desorption steps. Computer 138 can then generate an endpoint signal indicated by arrow 140 which is sent to a chamber controller 142. Controller 142 can then use endpoint signal 140 to stop the processing and/or heating of the substrate.

Chamber 102 can further contain within its interior other conventional parts and structures, which are omitted from FIG. 1 to simplify the illustration.

RF power is supplied to the coil 104 and inductively coupled to the plasma within processing chamber 102 through dielectric window 120, which may be made of quartz or another suitable dielectric material. When RF system 106 is turned on, the RF power from the coil 104 energizes the injected etchant source gases into a plasma state such that reactive plasma species are present within chamber 102. RF system 114 may also be turned on to provide RF power to chuck 112 and to bias substrate 110. The reactive plasma species can then react with the surface of substrate 110 to etch away portions of substrate 110 unprotected by a protective mask (e.g., a hard mask or a photoresist mask), thereby forming the desired features on the substrate surface. Most of the byproducts, which are generated through the reaction between the plasma species themselves, between the plasma species and the substrate films and/or between the plasma species and the protective overlying layer (e.g., photoresist) are then exhausted through exhaust port 116.

At the end of the etch sequence, various etch byproducts, particularly the less volatile byproducts, may remain within plasma processing chamber 102 and become chemically adsorbed on the surfaces of the substrate. Typical etch chemistries used in etching semiconductor substrates include halogens such as Cl, F and Br. In an etch process, the chemical species adsorbed onto the substrate surface will typically include a halogen. In a deposition process, the adsorbed species can include chemical species present in the reactant gas itself (e.g., TEOS).

Upon removal from the plasma chamber, these adsorbed species can cause defects or otherwise damage the substrate. For example, adsorbed chemical species comprising halogens can form acid gases which can corrode the substrate. These adsorbed species can also react with moisture in the air to form chemical condensates (e.g., particles) which can cause defects in later processing. In a polysilicon etch, the chemical condensates formed on the substrate typically contain some combination of Si, O and halogens.

In a preferred embodiment of the invention, the substrate includes a gate conductor layer (typically polysilicon) disposed over a gate dielectric layer (typically $SiO_2$) and the etching step involves etching through the gate conductor layer to expose at least a portion of the gate dielectric layer.

According to a first embodiment of the invention, the etched or otherwise plasma processed substrate 110 is then heated in-situ in processing chamber 102. The substrate can be heated in-situ by conduction, convection and/or radiant heating. For example, the substrate can be heated via thermal conduction by heaters (not shown) mounted in substrate support 112 or chuck 128. Alternatively, the substrate can be heated using radiant heaters (not shown). When radiant heating is employed, the heaters can be mounted either inside or outside of processing chamber 102. The substrate can also be heated by convection. For example, a heated inert gas (e.g., Ar, He, etc.) can be injected into processing chamber 102 and directed at the substrate surface. In a preferred embodiment, however, the substrate is heated in-situ by treatment with an inert plasma.

Before treating the substrate with an inert plasma, processing chamber 102 is typically purged to remove any remaining processing gases and/or volatile etch byproducts. Processing chamber 102 is then supplied with the inert gas. In a preferred embodiment, the inert gas is He or Ar. Other inert gases (e.g., Ne, Xe, Kr, etc.) or combinations of inert gases, however, can also be used. The type of inert gas employed can influence the energy of the ions bombarding the substrate. At a constant ion velocity, the energy of an ion will increase with its mass. Thus lighter He atoms will possess less energy at the same velocity than heavier species such as Ar. When delicate structures are present on the substrate (e.g., exposed gate oxide layers), an atom having a lower mass (e.g., He) can be used to reduce sputtering and potential damage to the substrate. Also, higher plasma densities can be used with inert gases of lighter atoms such as He while still minimizing sputtering of the substrate surface.

After the inert gas is supplied to processing chamber 102, power is then applied to RF coil 104 to energize a plasma from the injected inert gas, thereby producing plasma species within chamber 102. RF system 114 may also be turned on to bias substrate 110 during treatment with the inert plasma.

When the plasma is energized, electrons are accelerated by the applied RF field and collide in elastically with the inert gas molecules to produce a complex mixture of reactive species including ions, atoms, and radicals. During plasma processing, an electron-free space-charge region designated as a "sheath" forms between the plasma and contacting solid surf-aces including the substrate surface. Ions in the plasma are accelerated toward the surface when entering this plasma sheath. The characteristics of the plasma sheath can thus have an influence over incident ion fluxes and their energies and, consequently, can influence the characteristics and consequences (e.g., sputtering of the substrate surface vs. bombardment without sputtering) of plasma-surface interactions.

In the present invention, during treatment of the substrate with the inert plasma, the energy gained by the ions as they are accelerated through the plasma sheath between the substrate and the plasma is preferably 100 volts or less, more preferably 50 volts or less. It is believed that sputtering begins to occur at ion energies of approximately 50 volts. By maintaining the energy gained by the ions as they are accelerated through the plasma sheath between the substrate and the plasma to a level of 100 volts or less, sputtering of the substrate surface can be minimized.

Treatment of the substrate with the inert plasma will preferably be conducted for less than 20 seconds, more preferably less than 12 seconds. Shorter times result in greater process efficiency. However, treatment of the substrate with the inert plasma can also be conducted for longer times. Longer process times may be necessary where delicate structures subject to damage are present on the substrate. Photoresist layers, for example, often comprise organic polymers which can reticulate (burn) at elevated temperatures. The presence of these structures on the substrate may therefore limit substrate temperatures which can be achieved during treatment with the inert plasma. During in-situ treatment with the inert plasma, the substrate will preferably reach a temperature of at least 80° C. Significantly higher temperatures (e.g., as high as 300° C.) can also be realized. Higher temperatures, will generally allow for shorter treatment times but may result in damage to the substrate.

In a preferred embodiment of the invention, the heat transfer gas which is used to control the temperature of substrate 110 during processing is turned off prior to treating substrate 10 with the inert plasma. In this manner, heat transfer from the substrate to the substrate support can be reduced. In a further preferred embodiment, the substrate 110 can be lifted off of the substrate support 112 (e.g., by raising lifter 126) prior to or during heating in order to more effectively thermally isolate the substrate from the substrate support. In this manner, the temperature of the substrate can be increased more rapidly when thermal energy is applied thereto by convection, radiant heating or treatment with an inert plasma. If heating the substrate via conduction from a heated substrate support or chuck, efficient heat transfer from the substrate support to the substrate would be desirable.

Figure 2:
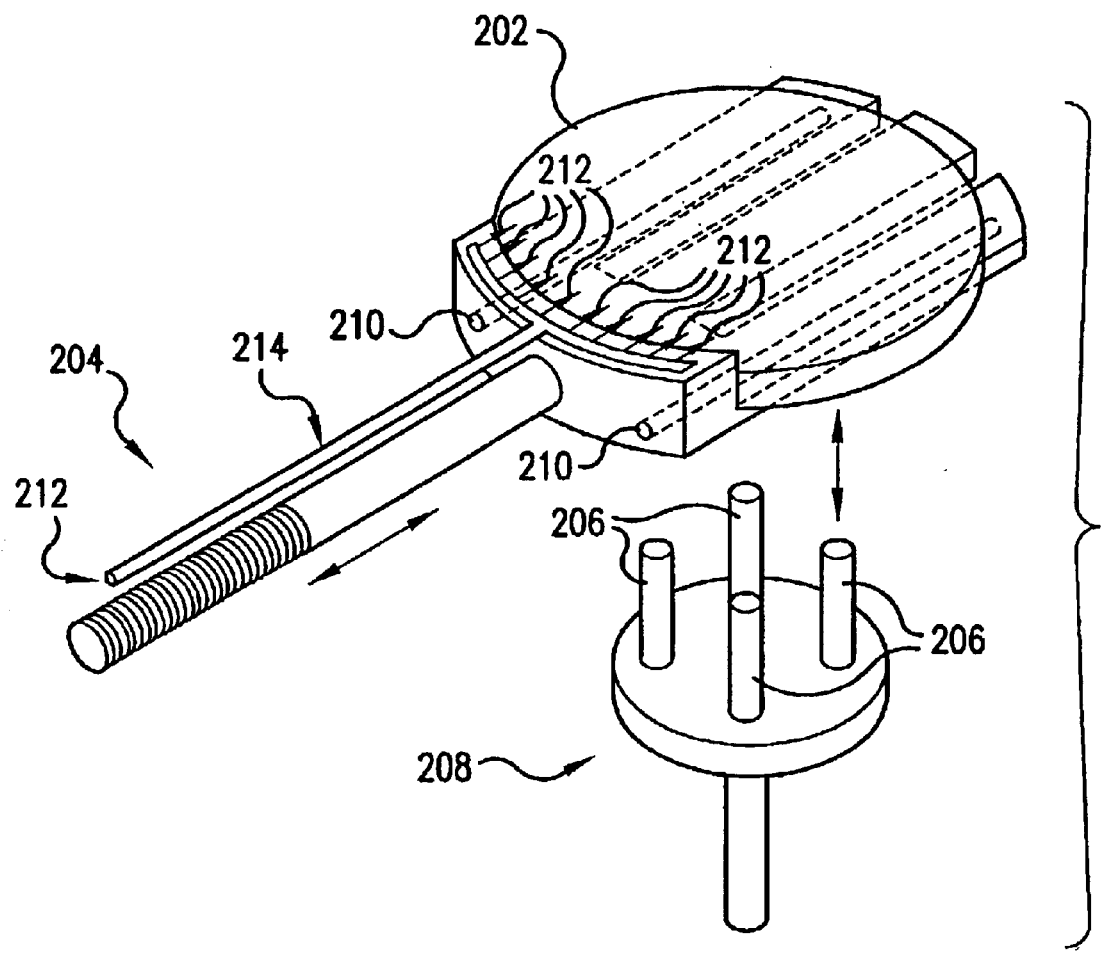
FIG. 2 shows a perspective view of a substrate transport mechanism according to the invention and a lift pin arrangement.

According to a second embodiment of the invention, thermal desorption can be performed ex-situ. Ex-situ thermal desorption can, for example, be performed with a heated substrate transport mechanism such as a robotic arm. FIG. 2 shows a substrate 202 supported on a robotic arm 204. A lift pin mechanism 208 having four lift pins 206 is shown below the substrate 202. The robotic arm 204 has openings (slits are shown) to allow the arm to slide into position under the substrate when the substrate is raised using lift pins 206. In the present invention, the robotic arm 204 can be provided with one or more heaters 210 to transfer thermal energy to the substrate 202 during transport. As shown in FIG. 2, heater 210 can be a resistance heater embedded or otherwise mounted in the robotic arm 204. Other types of heaters may also be employed, however. Further, the gas supplied to the substrate may itself be heated. In this manner, the substrate can be heated via forced convection. The inert purge gas may, for example, be heated by heaters incorporated into the purge gas supply (not shown). By heating the substrate during transfer, thermal desorption of chemical species adsorbed on the substrate surface can be realized during substrate transport.

The substrate may also be purged with an inert gas during transport from processing chamber 102. In FIG. 2, inert gas 212 is shown being supplied through conduit 214 that is external to robotic arm 204. The inert gas 212 could also be supplied, however, by an internal conduit (not shown) running along the length of the robotic arm or by a remote gas supply. By heating the substrate 202 and purging inert gas 212 over the substrate surface during transport, chemical species present on the substrate surface can be effectively reduced or eliminated via thermal desorption.

Heating ex-situ can also be performed in a separate processing chamber or in a transport module such as a load lock. For example, the substrate can be processed in a first processing chamber and then transported into a second processing chamber wherein the substrate can be heated to thermally desorb adsorbed chemical species. The substrate can be heated in the second processing chamber by any of the aforementioned methods including, but not limited to, conduction, convection and/or radiant heating. Further, if the second processing chamber is a plasma chamber, the substrate can be heated by treating the substrate with an inert plasma. Further, if the substrate is transported out of the first processing chamber and into a transport module such as a load lock, heating can be conducted in the transport module using any of the aforementioned heating means including, but not limited to, conduction, convection, and/or radiant heating. Further, if the transport module is provided with a plasma generating capability, the substrate can be treated with an inert plasma in the transport module. In this embodiment, the transport module can itself be considered a second processing chamber.

After removal from the processing chamber, the substrate 202 can be transported to another apparatus for further processing. For example, if the substrate has a photoresist layer, the substrate can be transported to a photoresist stripping apparatus for removal of the photoresist.

Figure 3:
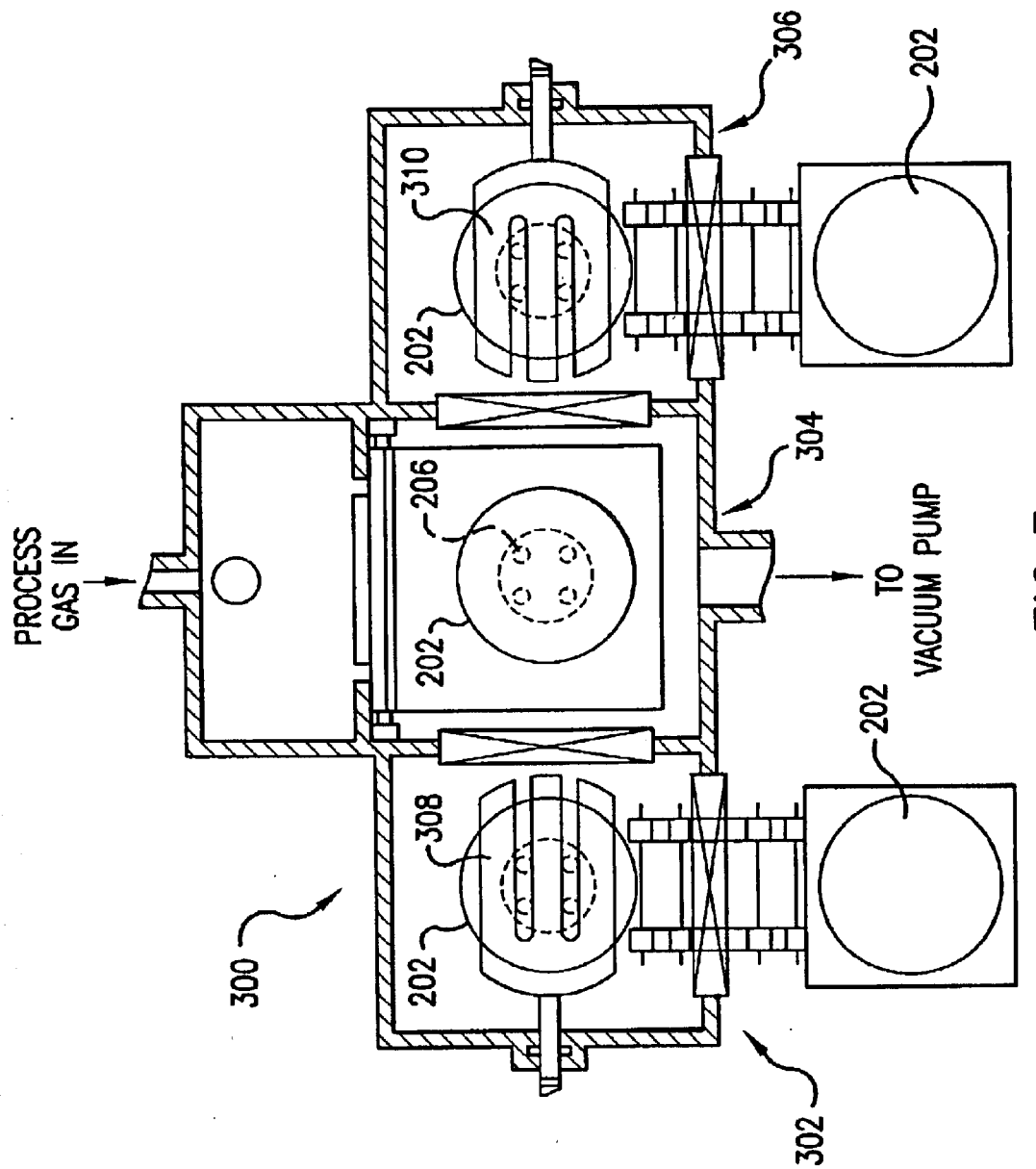
FIG. 3 shows a cross section of a semiconductor processing apparatus including the substrate transport mechanism of FIG. 2.

FIG. 3 shows the robotic arm of FIG. 2 as part of a semiconductor processing apparatus 300 including an entrance load lock 302, a substrate processing chamber 304 and an exit load lock 306. According to the invention, a semiconductor process using the apparatus of FIG. 3 can include steps of: (1) moving a first robotic arm 308 supporting a substrate 202 to be processed such that substrate 202 is transferred to a process position in a processing chamber 304; (2) raising a lifer (not shown) having a plurality of lift pins 206 to an upper position at which the substrate 202 is supported on upper ends of lift pins 206; (3) retracting the first robot arm 308 away from substrate 202; (4) lowering the lifter to a lower position at which the substrate 202 is supported on a substrate holder (not shown) in substrate processing chamber 304; (5) clamping substrate 202 to the substrate holder, (6) supplying a heat transfer gas between substrate 202 and the substrate support; (7) processing substrate 202 with a plasma, wherein, during processing, chemical species present in the reactor are adsorbed onto the substrate surface; (8) unclamping substrate 202, (9) raising the lifter to an upper position, (10) optionally heating substrate 202 to raise the temperature of the substrate and to thereby thermally desorb adsorbed chemical species from the substrate surface, (11) transporting substrate 202 out of the substrate processing chamber 304 and into exit load lock 306 with a second robotic arm 310, and (12) removing substrate 202 from exit load lock 306.

Thermal energy can be applied to substrate 202 while an inert gas is purged over the surface of substrate 202 during transfer of substrate 202 out of processing chamber 304 and/or out of exit load lock 306. Thermal energy can be applied to the substrate during transport by purging a heated inert gas over the surface of the substrate or by conduction from a heated substrate transport mechanism. Substrate 202 can also be heated inside exit load lock 306 or, alternatively, substrate 202 can be transported to a second processing chamber (not shown) for heating. Heating in the exit load lock or in the second processing chamber can be conducted by any of the aforementioned heating methods. Further, if the second processing chamber is a plasma chamber, the substrate can be heated by treatment with an inert plasma.

In the present invention, the endpoint of the thermal desorption process can be determined by optical emission or other techniques. In the optical emission technique, the emission from a particular chemical species (e.g., the species being thermally desorbed during the beating step) can be monitored at a specified wavelength. As the adsorbed chemical species is desorbed from the substrate surface, the emission level will decrease and level off to a low value when the adsorbed species is removed from the substrate surface, The concentration of the desorbed species can also be determined by analyzing the gas in the reactor during heating using a mass spectrometer or other gas analyzer (e.g., a residual gas analyzer).

The foregoing has described the principles, preferred embodiments and modes of operation of the present invention. However, the invention should not be construed as being limited to the particular embodiments discussed. Thus, the above-described embodiments should be regarded as illustrative rather than restrictive, and it should be appreciated that variations may be made in those embodiments by workers skilled in the art without departing from the scope of the present invention as defined by the following claims.

What is claimed is:

1. A semiconductor substrate transport mechanism comprising:
   an arm;
   a substrate support member located at one end of the arm, the substrate support member having a support surface adapted to support the semiconductor substrate;
   one or more heaters adapted to apply thermal energy to the semiconductor substrate supported on the support surface; and
   a gas supply adapted to purge an inert gas over the surface of the semiconductor substrate supported on the support surface.

2. The substrate transport mechanism of claim 1, wherein the one or more heaters are resistance heaters mounted in the substrate transport mechanism.

3. The substrate transport mechanism of claim 1, wherein the inert gas supply is adapted to purge a heater inert gas over the surface of a substrate supported on the support surface.

4. The substrate transport mechanism of claim 1, wherein the one or more heaters are radiant heaters mounted on the substrate transport mechanism.

5. The semiconductor substrate support mechanism of claim 1, wherein the gas supply comprises a conduit external to the arm through which the inert gas is supplied to the surface of the semiconductor substrate supported on the support surface.

6. The semiconductor substrate support mechanism of claim 1, wherein the arm is retractable away from the semiconductor substrate.

7. An apparatus comprising:
   the semiconductor substrate support mechanism according to claim 1; and
   a plurality of lift pins adapted to support the semiconductor substrate,
   wherein the arm of the semiconductor substrate support mechanism is slidable under the semiconductor substrate supported on the lift pins.

8. The apparatus of claim 7, wherein the arm of the semiconductor substrate support mechanism includes a plurality of openings configured to allow the arm to slide under the semiconductor substrate supported on the lift pins.

9. A semiconductor processing apparatus, comprising:
   a processing chamber;
   a first semiconductor substrate transport mechanism according to claim 1 operable to transport the semiconductor substrate into the processing chamber; and
   a second semiconductor substrate transport mechanism according to claim 1 operable to transport the semiconductor substrate from the processing chamber.

10. The apparatus of claim 9, further comprising:
    an entrance load lock; and
    an exit load lock;
    wherein:
    the first semiconductor substrate transport mechanism is operable to transport the semiconductor substrate from the entrance load lock to the processing chamber; and
    the second semiconductor substrate transport mechanism is operable to transport the semiconductor substrate from the processing chamber to the exit load lock.

11. The apparatus of claim 10, wherein the second semiconductor substrate transport mechanism is adapted to apply thermal energy to the semiconductor substrate during transfer of the semiconductor substrate from the processing chamber and/or when the semiconductor substrate is inside the exit load lock.

12. The apparatus of claim 11, wherein the gas supply of the second semiconductor substrate transport mechanism is adapted to purge a heated inert gas over the surface of the semiconductor substrate to thereby apply thermal energy to the semiconductor substrate.

13. The apparatus of claim 11, wherein the second semiconductor substrate transport mechanism is adapted to apply thermal energy to the semiconductor substrate by conduction.

14. A method of processing a semiconductor substrate in a semiconductor processing apparatus, comprising:

transporting a semiconductor substrate into a first processing chamber of a semiconductor processing apparatus using a first semiconductor substrate transport mechanism according to claim 1;

processing the semiconductor substrate in the first processing chamber; and transporting the processed semiconductor substrate from the first processing chamber using a second semiconductor substrate transport mechanism according to claim 1.

15. The method of claim 14, further comprising:

transporting the semiconductor substrate from an entrance load lock into the first processing chamber using the first semiconductor substrate transport-mechanism; and transporting the semiconductor substrate from the first processing chamber into an exit load lock using the second semiconductor substrate transport mechanism.

16. The method of claim 14, wherein, as a result of the processing, chemical species present in the first processing chamber are adsorbed onto the surface of the semiconductor substrate, and the method further comprises heating the semiconductor substrate to remove adsorbed chemical species from the surface of the semiconductor substrate by thermal desorption.

17. The method of claim 16, wherein the semiconductor substrate is heated with an inert plasma and RF biased during the heating in a second processing chamber of the semiconductor processing apparatus.

18. The method of claim 14, further comprising applying thermal energy to the semiconductor substrate and purging heated inert gas over the surface of the semiconductor substrate during transporting of the semiconductor substrate from the first processing chamber.

19. The method of claim 18, wherein the thermal energy is applied to the semiconductor substrate by conduction from the second substrate transport during transporting.

* * * * *